(12) United States Patent
Otake et al.

(10) Patent No.: US 9,819,129 B2
(45) Date of Patent: Nov. 14, 2017

(54) HARD DISK DRIVE WITH FEEDTHROUGH CONNECTOR

(71) Applicant: HGST Netherlands B.V., Amsterdam (NL)

(72) Inventors: Noritaka Otake, Kanagawa (JP); Hiroshi Matsuda, Kanagawa (JP); Katsumasa Nakatsukasa, Kanagawa (JP); Kouki Uefune, Kanagawa (JP)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 522 days.

(21) Appl. No.: 14/046,424

(22) Filed: Oct. 4, 2013

(65) Prior Publication Data

US 2015/0098178 A1   Apr. 9, 2015

(51) Int. Cl.
*H01R 13/74* (2006.01)
*G11B 33/14* (2006.01)
(Continued)

(52) U.S. Cl.
CPC .......... *H01R 13/74* (2013.01); *G11B 25/043* (2013.01); *G11B 33/1446* (2013.01);
(Continued)

(58) Field of Classification Search
CPC .... H01R 13/74; H01R 4/028; H01R 43/0235; G11B 33/1446; G11B 33/1466; H05K 5/069
See application file for complete search history.

(56) References Cited

U.S. PATENT DOCUMENTS

| 5,282,099 | A | 1/1994 | Kawagoe et al. |
| 5,337,202 | A * | 8/1994 | Jabbarai ............... G11B 5/4846 360/264.2 |

(Continued)

FOREIGN PATENT DOCUMENTS

| CN | 101086893 A | 12/2007 |
| CN | 101290791 A | 10/2008 |

(Continued)

OTHER PUBLICATIONS

European Search Report and search opinion for European Application No. 15157645.1 dated Jul. 7, 2015.

(Continued)

*Primary Examiner* — Hoa C Nguyen
*Assistant Examiner* — Keith Depew
(74) *Attorney, Agent, or Firm* — Kunzler, PC (57) ABSTRACT

Described herein is an apparatus that includes a housing that defines an interior cavity. The housing also includes a feedthrough aperture. The apparatus also includes an electrical connector that is coupled to the housing over the feedthrough aperture. The electrical connector includes a base, a plurality of pins extending through the base, and a skirt positioned about a periphery of the base. The pins extend from a location external to the housing to a location within the interior cavity of the housing. Further, an inner surface of the base is co-planar with an outer end of the feedthrough aperture. The apparatus also includes solder positioned on the housing and against an entire periphery of the skirt to seal the electrical connector to the housing.

20 Claims, 6 Drawing Sheets

(51) Int. Cl.
  *H01R 4/02* (2006.01)
  *H01R 43/02* (2006.01)
  *G11B 25/04* (2006.01)
  *H05K 5/06* (2006.01)
  *B23K 1/00* (2006.01)

(52) U.S. Cl.
  CPC ......... *G11B 33/1466* (2013.01); *H01R 4/028* (2013.01); *H01R 43/0235* (2013.01); *H05K 5/069* (2013.01); *B23K 1/0016* (2013.01)

(56) References Cited

U.S. PATENT DOCUMENTS

| | | | |
|---|---|---|---|
| 5,454,157 | A | 10/1995 | Ananth et al. |
| 5,541,787 | A * | 7/1996 | Jabbari ................ G11B 5/4846 |
| | | | 310/71 |
| 5,931,367 | A | 8/1999 | Sato et al. |
| 5,931,697 | A * | 8/1999 | Jeong ................... G11B 5/4846 |
| | | | 439/556 |
| 5,956,213 | A | 9/1999 | Dague et al. |
| 5,994,975 | A | 11/1999 | Allen et al. |
| 6,129,579 | A | 10/2000 | Cox et al. |
| 6,168,459 | B1 | 1/2001 | Cox et al. |
| 6,567,235 | B2 * | 5/2003 | Kasetty ............... G11B 33/1433 |
| | | | 360/99.18 |
| 6,594,107 | B2 | 7/2003 | Hayakawa et al. |
| 6,678,112 | B1 | 1/2004 | Kaneko |
| 6,702,592 | B1 * | 3/2004 | Harden ................ G11B 33/122 |
| | | | 310/71 |
| 6,970,322 | B2 | 11/2005 | Bernett |
| 6,989,493 | B2 | 1/2006 | Hipwell, Jr. et al. |
| 7,016,145 | B2 | 3/2006 | Gunderson et al. |
| 7,123,440 | B2 | 10/2006 | Albrecht et al. |
| 7,137,196 | B2 | 11/2006 | Gunderson et al. |
| 7,599,147 | B2 | 10/2009 | Gunderson |
| 7,872,836 | B2 | 1/2011 | Shindo et al. |
| 7,876,527 | B2 * | 1/2011 | Nakamiya ............ G11B 25/043 |
| | | | 360/97.22 |
| 8,035,923 | B2 | 10/2011 | Suzuki et al. |
| 8,059,364 | B1 * | 11/2011 | Andrikowich ....... G11B 25/043 |
| | | | 360/99.22 |
| 8,098,454 | B2 | 1/2012 | Kouno et al. |
| 8,179,631 | B2 | 5/2012 | Aoyagi et al. |
| 8,194,348 | B2 | 6/2012 | Jacoby et al. |
| 8,279,552 | B2 | 10/2012 | Stipe |
| 8,373,075 | B2 | 2/2013 | Munns et al. |
| 8,749,914 | B2 | 6/2014 | Otake et al. |
| 2006/0002067 | A1 * | 1/2006 | Gunderson .......... G11B 25/043 |
| | | | 361/724 |
| 2006/0050429 | A1 | 3/2006 | Gunderson et al. |
| 2008/0024908 | A1 * | 1/2008 | Nakamiya ............ G11B 25/043 |
| | | | 360/97.22 |
| 2008/0144273 | A1 | 6/2008 | Mewes et al. |
| 2008/0165449 | A1 | 7/2008 | Shindo et al. |
| 2008/0259503 | A1 * | 10/2008 | Aoyagi ................. G11B 33/08 |
| | | | 360/244 |
| 2009/0034113 | A1 | 2/2009 | Hashi et al. |
| 2009/0097163 | A1 * | 4/2009 | Suzuki ............... G11B 33/1466 |
| | | | 360/245.8 |
| 2009/0097375 | A1 * | 4/2009 | Uefune ................ G11B 25/043 |
| | | | 369/75.11 |
| 2009/0168233 | A1 | 7/2009 | Kouno et al. |
| 2010/0328815 | A1 * | 12/2010 | Nakatsuka .......... G11B 25/043 |
| | | | 360/110 |
| 2011/0056731 | A1 * | 3/2011 | VandenEynden ...... H01B 17/30 |
| | | | 174/152 GM |
| 2011/0211279 | A1 | 9/2011 | Jacoby et al. |
| 2012/0182645 | A1 | 7/2012 | Kurokawa et al. |
| 2013/0063838 | A1 * | 3/2013 | Otake ................. G11B 25/043 |
| | | | 360/97.12 |
| 2015/0257293 | A1 * | 9/2015 | Hirano ............... G11B 33/1446 |
| | | | 361/679.33 |

FOREIGN PATENT DOCUMENTS

| | | |
|---|---|---|
| CN | 101911200 A | 12/2010 |
| CN | 102481454 A | 5/2012 |
| CN | 102934177 A | 2/2013 |
| EP | 0529345 | 3/1993 |
| WO | 2010030998 | 3/2010 |
| WO | 2011031609 A2 | 3/2011 |
| WO | 2011059381 A1 | 5/2011 |

OTHER PUBLICATIONS

Notice of Allowance for U.S. Appl. No. 14/199,133 dated Jul. 10, 2015.
SGA Technologies, Multi Pin Feedthrough, http://www.sgatech.co.uk/glass-to-metal-seals/types-of-seal/multi-pin-feedthrough, Received Jan. 29, 2014, Retrieved Mar. 6, 2014.
Office Action for U.S. Appl. No. 14/199,133 dated Mar. 24, 2015.
Chinese Office Action and Search Report for Chinese Patent Application No. 201410524899.7 dated Apr. 6, 2016.
Combined Search and Examination Report for Great Britain Patent Application No. GB1417441.1 dated Feb. 20, 2015.
Office Action for European Application No. 15157645.1 dated May 11, 2017.
Chinese Office Action with English summary for Chinese Patent Application No. 201510341901.1 dated Jun. 9, 2017.

* cited by examiner

HARD DISK DRIVE WITH FEEDTHROUGH CONNECTOR

FIELD

This disclosure relates generally to hard disk drives, and more particularly to electrical connectors of hard disk drives for electrically connecting hard disk drives to a computing device.

BACKGROUND

Hard disk drives are commonly used for storing and retrieving digital information using rapidly rotating discs or platters coated with magnetic material. Digital information is transferred between a hard disk drive and a computing device by virtue of an electrical connector forming part of the hard disk drive. Conventional electrical connectors include non-feedthrough connectors (e.g., P2 connectors) and feedthrough connectors.

Feedthrough connectors are defined by a plurality of electrically conductive pins extending from outside a housing of the hard disk drive to within an interior cavity of the hard disk drive. The portion of the pins external to the housing are electrically coupled to a mating electrical connector of a computing device, while the portion of the pins internal to the housing are electrically coupled to various components of the hard disk drive. Feedthrough connectors are retained in place on the housing by applying a layer of adhesive or weldment, such as solder, on the housing and around the connector.

Some conventional feedthrough connectors include a base that retains the pins in place, and a skirt that extends about the periphery of the base. The base is made from an electrically non-conductive material, such as glass, and the skirt is commonly made from a metallic material. Traditionally, the base has a square-shaped or rectangular-shaped outer periphery, and the skirt has a correspondingly square or rectangular shape. Such a shape is particularly susceptible to cracking or separation between the connector and the housing due to the formation of stress risers at the corners of the base. As the interior of the hard disk drive heats up during operation of the hard disk drive, the base tends to expand and the housing tends to contract, which promotes the formation of stress risers at the corners of the base.

Due to the quantity of pins relative to the size of the base, the base of conventional feedthrough connectors, particularly those made from glass, is necessarily quite thin. Because the base is thin, the amount or thickness of solder applied to the connector to retain it in place on the housing is limited. Unfortunately, a thinner solder joint with less solder weakens the seal between the solder and the connector. In an attempt to strengthen the seal, some conventional feedthrough connectors employ a skirt with an increased height to facilitate thicker solder joints with more solder. However, such feedthrough connectors are configured and assembled in a manner that promotes the splashing of solder onto an interior surface of the base. Splashed solder on the base may act to inadvertently electrically couple adjacent pins, which can lead to a short-circuit of the connector and a defective hard disk drive.

SUMMARY

The subject matter of the present application has been developed in response to the present state of the art, and in particular, in response to the problems and needs associated with hard disk drives and associated electrical connectors that have not yet been fully solved by currently available methods, apparatus, and systems. Accordingly, the subject matter of the present application has been developed to provide a hard disk drive with a sealed electrical connector, and associated apparatus, systems, and methods, which overcomes at least some of the above-discussed shortcomings of prior art methods, apparatus, and systems.

According to one embodiment, an apparatus includes a housing that defines an interior cavity. The housing also includes a feedthrough aperture. The apparatus also includes an electrical connector that is coupled to the housing over the feedthrough aperture. The electrical connector includes a base, a plurality of pins extending through the base, and a skirt positioned about a periphery of the base. The pins extend from a location external to the housing to a location within the interior cavity of the housing. Further, an inner surface of the base is co-planar with an outer end of the feedthrough aperture. The apparatus also includes solder positioned on the housing and against an entire periphery of the skirt to seal the electrical connector to the housing.

In some implementations of the apparatus, the base has a racetrack, elliptical, or ovular shape. According to certain implementations, the base is made from glass. The skirt can have a height that is greater than a thickness of the base such that an upper surface of the skirt is elevated above an outer surface of the base. In some implementations, the housing includes a connector receptacle, and the feedthrough aperture is formed in the connector receptacle. The electrical connector and solder can be positioned within the connector receptacle. The solder can have a thickness greater than a thickness of the base.

In yet some implementations of the apparatus, the skirt may include a sidewall that extends from an inner end to an outer end. The inner end contacts an exterior surface of the housing about the feedthrough aperture, and the outer end is positioned away from the exterior surface of the housing. The inner surface of the base can be flush with the inner end of the skirt.

According to another embodiment, a hard disk drive includes a hermetically sealed housing that defines an interior cavity. The housing includes a feedthrough aperture. The hard disk drive also includes an electrical connector that is coupled to the housing over the feedthrough aperture. The electrical connector includes a base, a plurality of pins extending through the base, and a skirt coupled to the base about a periphery of the base. The skirt has a height larger than a thickness of the base. The pins extend from a location external to the housing to a location within the interior cavity of the housing. Further, an inner surface of the base is directly adjacent an outer end of the feedthrough aperture. The base has a generally racetrack, elliptical, or ovular shape. Additionally, the hard disk drive includes solder positioned on the housing and against an entire periphery of the skirt to seal the electrical connector to the housing.

In some implementations of the hard disk drive, the solder has a thickness greater than a thickness of the base. The skirt can have a height that is greater than a thickness of the base such that an upper surface of the skirt is elevated above an outer surface of the base. The housing can include a connector receptacle with an outer recess and an inner recess. The electrical connector can be positioned within the inner recess and the solder can be positioned within the outer and inner recess. The base can be made from glass, and the skirt can be made from metal. Further, the inner surface of the base can be co-planar with the outer end of the feedthrough aperture.

According to yet another embodiment, a method for making an electrical device, which has a housing with an aperture formed in the housing, includes positioning an electrical connector on the housing over the aperture. The electrical connector includes a base, a plurality of pins extending through the base, and a skirt extending about the periphery of the base. Positioning the electrical connector on the housing over the aperture includes extending the plurality of pins through the aperture. The method also includes orienting the electrical connector such that the base of the electrical connector is directly adjacent the aperture formed in the housing. Additionally, the method includes applying solder onto the housing about the electrical connector to seal the electrical connector to the housing. In certain implementations, the method includes preventing solder from contacting the base of the electrical connector.

In some implementations of the method, applying solder about the electrical connector includes applying solder against an outer periphery of the skirt. Orienting the electrical connector can include orienting the skirt such that the skirt extends outwardly away from an outer surface of the base.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1:
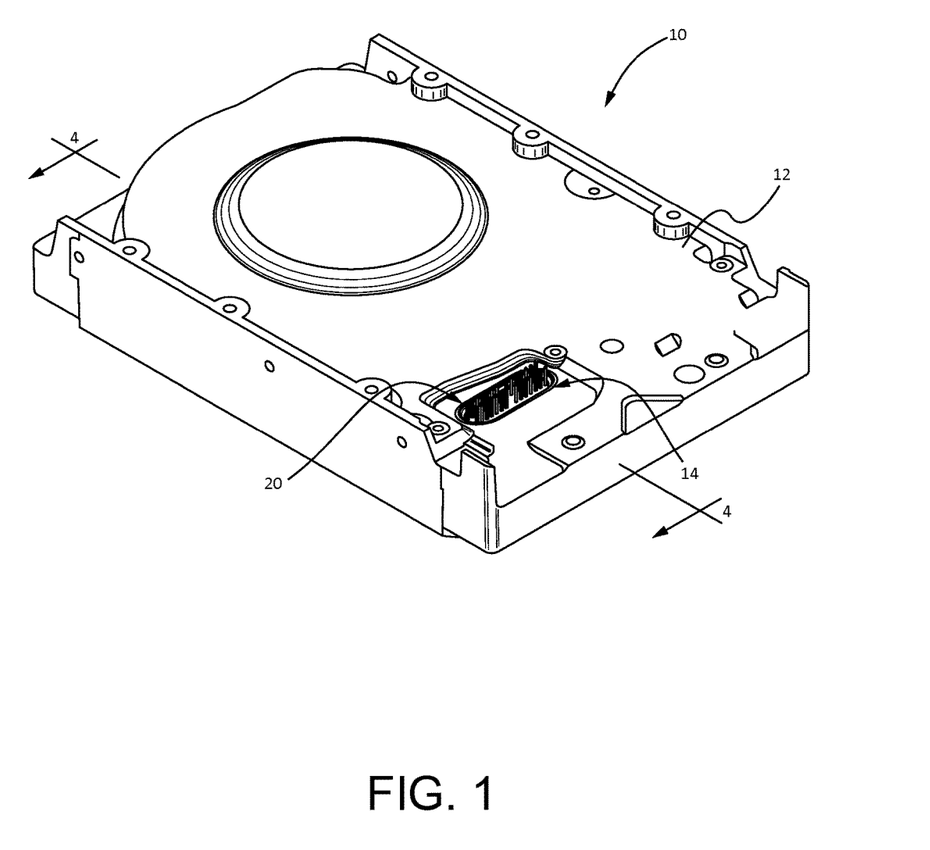
FIG. 1 is a perspective view of a hard disk drive with an electrical connector according to one embodiment.

Referring to FIG. 1, one embodiment of a hard disk drive 10 includes a housing 12, a connector receptacle 14, and an electrical connector 20. The housing 12 of the hard disk drive 10 houses and protects the various components configured to store and retrieve. The components may include magnetic recording media (e.g., disks), read/write heads, actuators (e.g., swings arms), electrical circuitry, and the like. The hard disk drive 10 can placed in electrical communication with a computing device (not shown) to store data for operation of the computing device. The housing 12 is configured to hermetically seal the components of the hard disk drive 10 from the environment. In certain implementations, the housing 12 includes two or more sections coupled together in a manner to maintain the sealing nature of the housing. In certain implementations, housing maintains an interior of the housing and the components at a pressure below atmospheric pressure. Because the components of hard disk drives are sensitive to contaminants and pressure changes, hermetically sealing the internal components of the hard disk drive 10 from the environment promotes proper operation and extends the life of the hard disk drive.

Figure 4:
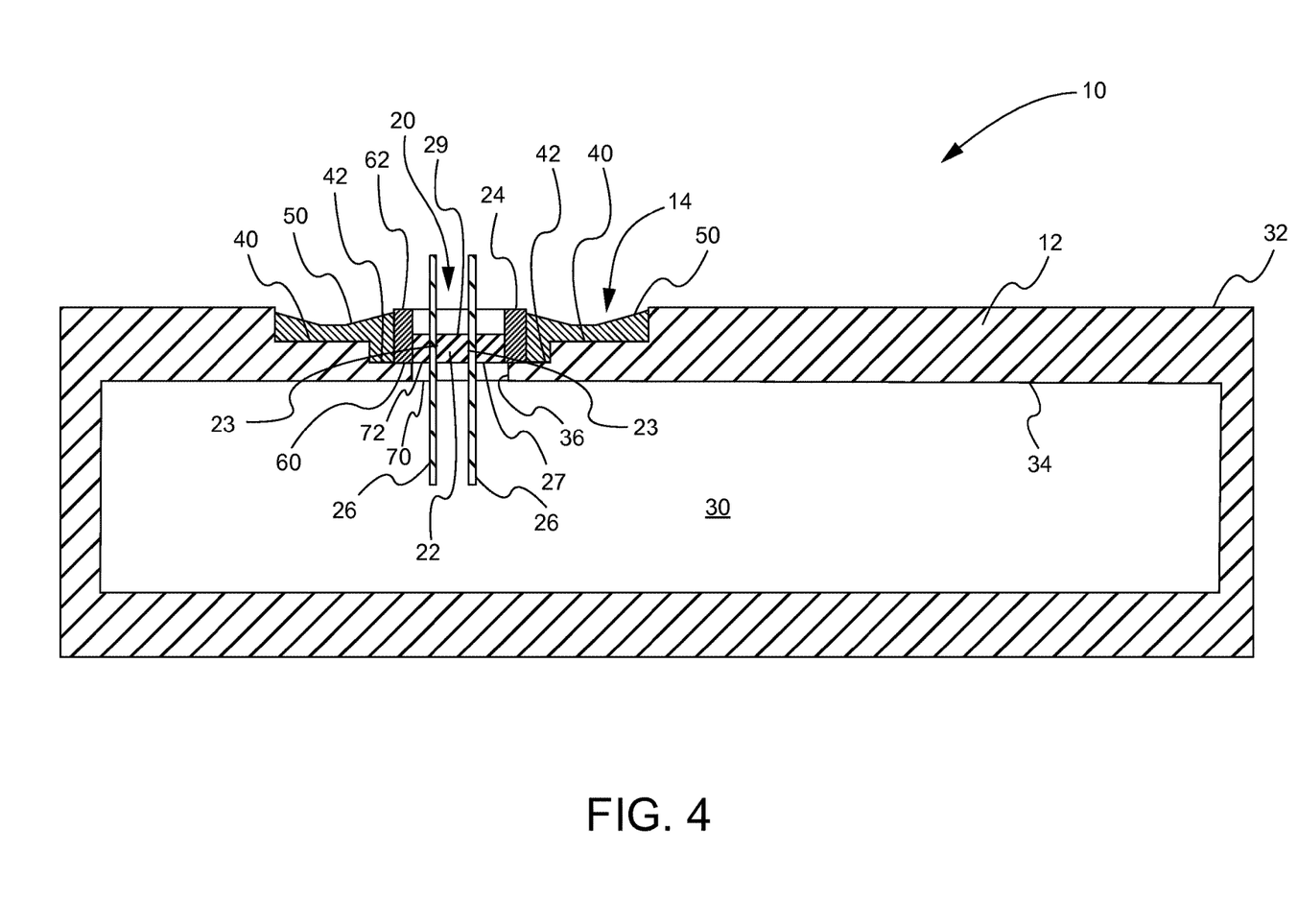
FIG. 4 is a cross-sectional side view of the hard disk drive of FIG. 1 taken along the line 4-4 of FIG. 1.

The housing 12, which can be made from any of various materials, such as hardened plastics, metal, and the like, includes the connector receptacle 14. As shown in FIG. 4, in certain implementations, the connector receptacle 14 is formed in an exterior surface 32 of the housing about a feedthrough aperture or opening 36 also formed in the housing. The feedthrough aperture 36 is open at an inner end 70 to an interior cavity 30 defined by an interior surface 34 of the housing 12, and open at an outer end 72 to the connector receptacle 14. In this manner, access to the interior cavity 30 of the housing 12 is available through the connector receptacle 14 and the feedthrough aperture 36.

Generally, the connector receptacle 14 is configured to receive the electrical connector 20 and retain a layer of solder 50 applied about the electrical connector to secure the electrical connector in place. The connector receptacle 14 has a stepped configuration that transitions from an outer recess 40 to an inner recess 42. The outer recess 40 has an outer periphery larger than the outer periphery of the inner recess 42. Similarly, the outer periphery of the inner recess 42 is larger than the outer periphery of the feedthrough aperture 36. In certain implementations, the inner recess 42 can be defined as being formed in the outer recess 40, and the feedthrough aperture 36 can be defined as being formed in the inner recess. The shape of the outer recess 40 may be the same as or different than the shape of the inner recess 42. Moreover, the shape of feedthrough aperture 36 may be the same as or different than the shape of the inner recess 42. In one implementation, the shape of the inner recess 42 may be the same as the shape of the electrical connector 20. Likewise, in one implementation, the shape of the feedthrough aperture 36 may be the same as the shape of the electrical connector 20.

The outer periphery of the inner recess 42 defines an area larger than the area defined by the electrical connector 20, and the outer periphery of the feedthrough aperture 36 is smaller than the area defined by the electrical connector, such that the electrical connector can be supported on the inner recess 42 over the feedthrough aperture as shown.

Figure 2:
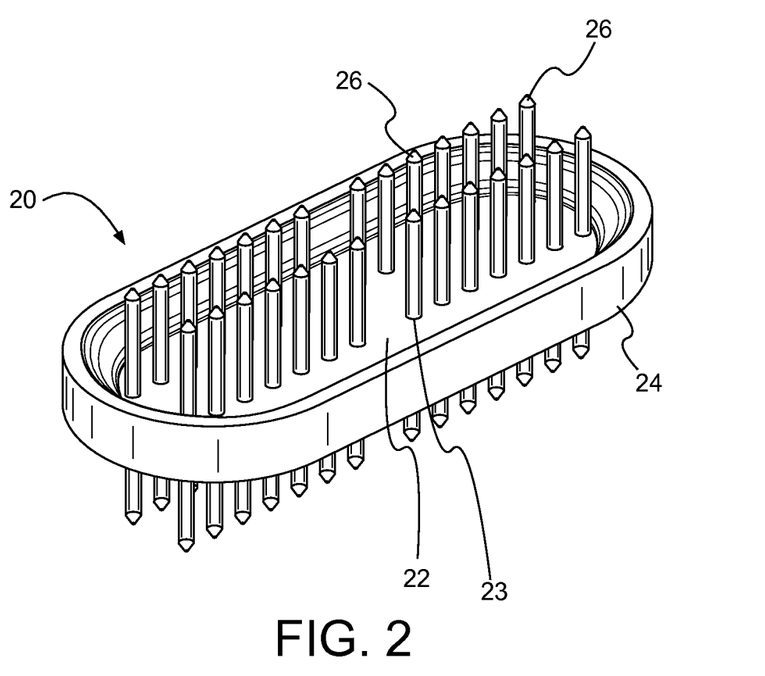
FIG. 2 is a perspective view of the electrical connector of FIG. 1.

Referring to FIG. 2, the electrical connector 20 includes a base 22 and a skirt 24 coupled to the base 22. The base 22 includes a plurality of apertures 23 through which a respective one of a plurality of pins 26 extends. The pins 26 are fixedly secured within the apertures 23 formed in the base 22. In one implementation, the apertures 23 are formed in the base 22, and the pins 26 are extended through the apertures to secure the pins within the apertures. In other implementations, the pins are held in place while the base 22 is formed about the pins using a molding or casting technique. The base 22 can include any number, configuration, or types of pins. In the illustrated embodiment, the base 22 includes two rows of fourteen pins 26. In the illustrated embodiment of FIG. 2, the base 22 can be made from any of various electrically non-conductive materials, such as glass, composites, ceramics, and the like.

Figure 5:
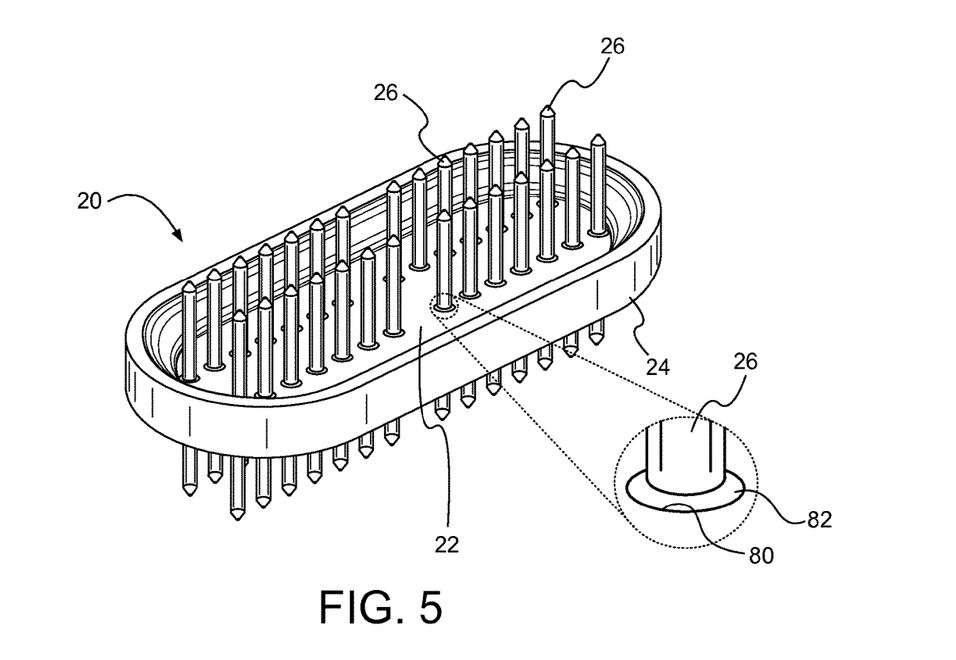
FIG. 5 is a perspective view of an electrical connector according to yet another embodiment.
Figure 6:
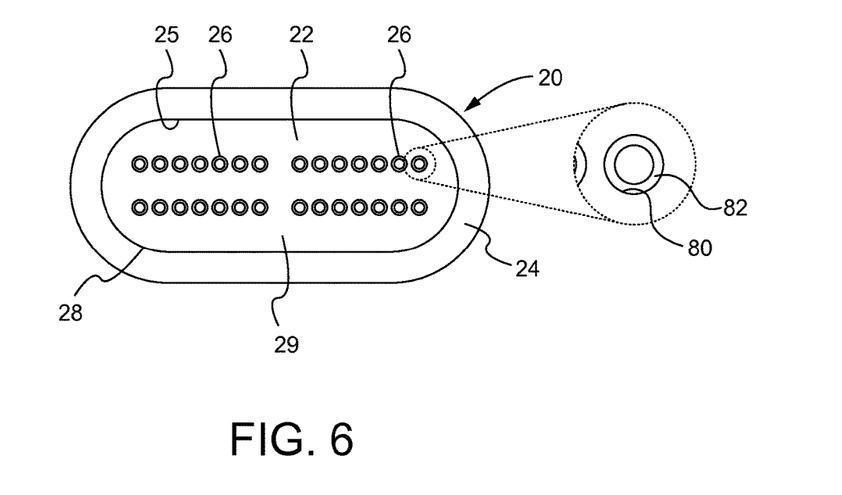
FIG. 6 is a top plan view of the electrical connector of FIG. 5.
Figure 7:
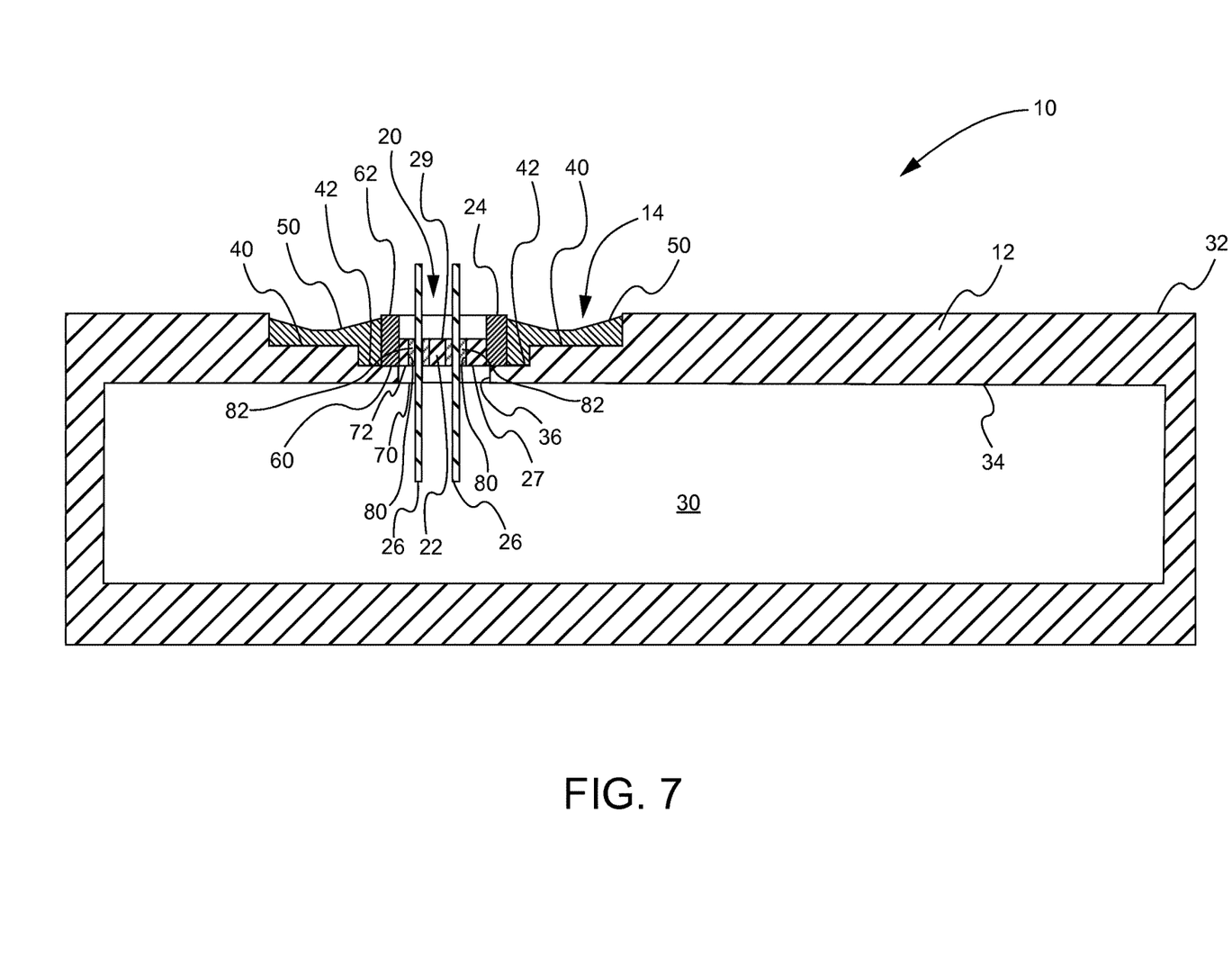
FIG. 7 a cross-sectional side view of the hard disk drive of FIG. 1 taken along the line 4-4 of FIG. 1 but with the electrical connector of FIG. 5.
Figure 8:
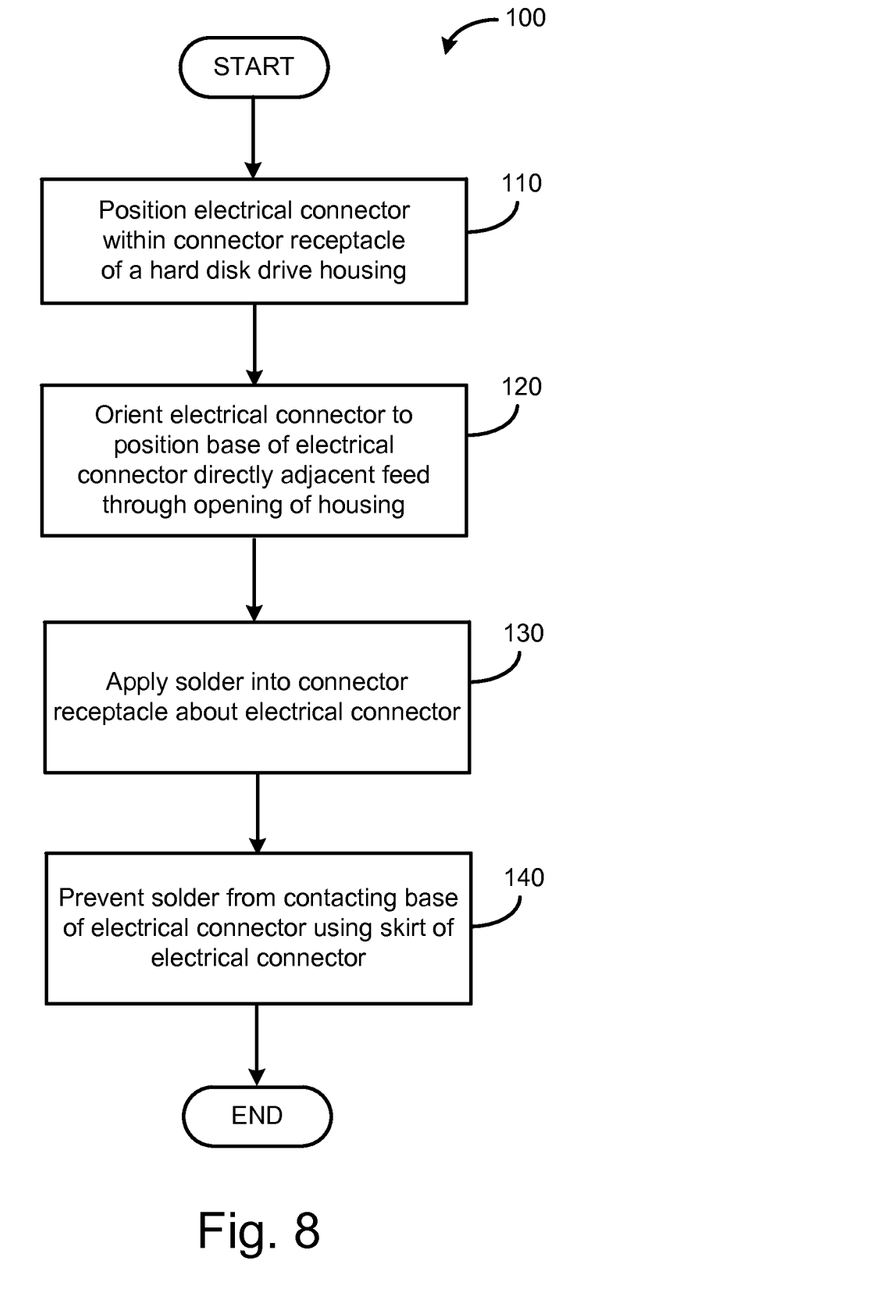
FIG. 8 is a flow chart diagram depicting a method for making a hard disk drive according to one embodiment.

In some embodiments, as shown in FIGS. 5-7, the base 22 of the electrical connector 20 includes a plurality of spaced-apart pin retainers 82 positioned within a plurality of apertures 80 formed in the base. The apertures 80 may be similar to the apertures 23 of the embodiment of FIGS. 1-4. However, the apertures 80 are sized larger than the apertures 23 to accommodate the placement of the pin retainers 82 within the apertures 80. The base 22 in the embodiment of FIGS. 5-7 is made from any of various electrically conductive materials, such as metals or metal alloys. To electrically isolate the pins 26 from the base 22 in this embodiment, the pin retainers 82 are made from any of various electrically non-conductive materials, such as glass, composites, ceramics, and the like. In the illustrated embodiment, each aperture 80 has a circular-shaped cross-section and each pin retainer 82 has a cylindrical shape with a circular-shaped cross-section corresponding with the cross-sectional shape of the apertures 80. In other embodiments, each aperture 80 and pin retainer 82 may have other cross-sectional shapes, such as square, rectangular, triangular, ovular, elliptical, or racetrack shaped.

The pin retainers 82 can be fixedly secured to the base 22 within the apertures 80 via any of various coupling techniques, such as adhesive, bonding, press-fit, and/or similar techniques. Each pin retainers 82 includes an aperture for receiving and retaining a respective one of the pins 26. The apertures of the pin retainers 82 may be pre-formed to receive the pins 26, or formed within the apertures 80 about the pins while the pins are maintained in place within the apertures 80.

The base 22 has a thickness that is much smaller than a length of the pins 26. Accordingly, portions of the pins 26 extend away from the base 22 on opposing sides of the base.

Figure 3:
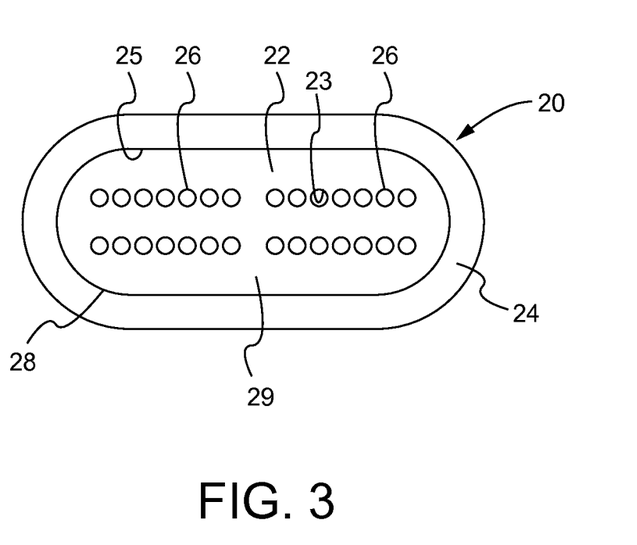
FIG. 3 is a top plan view of the electrical connector of FIG. 1.

The thickness of the base 22 is defined as the distance between an inner face surface 27 base and an outer face surface 29 of the base. The inner face surface 27 opposes the outer face surface 29, and extends substantially parallel to the outer face surface in some implementations. As shown in FIG. 3, the base 22 has a generally racetrack-shaped, ellipse-shaped, or ovular-shaped outer periphery 28. More specifically, in the illustrated embodiment, the outer periphery 28 of the base 22 includes two opposing sides extending substantially parallel to each other, with the sides being coupled together by semi-circular ends. In certain implementations, the outer periphery 28 of the base 22 may have a circular shape. In contrast to traditional feedthrough connectors, the base 22 is void of relatively sharp corners or edges. In this manner, the shape of the base 22 is configured to reduce cracking or separation between the connector and the housing by mitigating stress risers along the base. The base 22 can have other shapes as desired.

The skirt 24 is coupled to the base 22 and extends about the outer periphery 28 of the base. Accordingly, in the illustrated embodiment, the skirt 24 forms a continuous or annular ring with a shape corresponding with the shape of the outer periphery 28 of the base 22. For example, as shown, like the outer periphery 28 of the base 22, the skirt 24 also has a generally racetrack or ovular shape. The skirt 24 defines an aperture 25 within which the base 22 is positioned. In this manner, the skirt 24 entirely encircles the base 22. The skirt 24 can be made from any of various materials, such as glass, composites, ceramics, metals, and the like. Accordingly, in some implementations, the skirt 24 can be made from the same or a different material as the base 22. The base 22 may be coupled to the skirt 24 using any of various methods, such as adhesion techniques, co-molding techniques, and the like.

The skirt 24 has a height that is greater than a thickness of the base 22. The height of the skirt 24 is defined as the distance between a lower surface 60 of the skirt and an upper surface 62 of the skirt. In the illustrated embodiment, the base 22 is positioned within the aperture 25 of the skirt 24 such that the inner face surface 27 of the base is adjacent the lower surface 60 of the skirt. Because the height of the skirt 24 is greater than the thickness of the base 22, with the base in this position relative to the skirt, the upper surface 62 of the skirt is positioned away from (e.g., above) the outer face surface 29 of the base.

Referring to FIG. 5, according to one embodiment of a method 100 for making a hard disk drive, as applied to hard disk drive 10, the electrical connector 20 is positioned within the connector receptacle 14 formed in the housing 12 at step 110 of the method. Because the connector receptacle 14 is formed about the feedthrough aperture 36, step 110 may also include positioning the electrical connector 20 over the feedthrough aperture such that the pins 26 of the electrical connector extend through the feedthrough aperture. The method 100 includes orienting the electrical connector 20 relative to the connector receptacle 14 to position the base 22 of the connector directly adjacent the feedthrough aperture 36 at step 120. In the illustrated implementation, the base 22 is directly adjacent the feedthrough aperture 36 because the inner face surface 27 of the base is flush (e.g., co-planar) with an outward facing support surface of the inner recess 42 or the outer end 72 of the feedthrough aperture. In other words, in certain implementations, steps 110, 120 of the method 100 include positioning and orienting the electrical connector 20 such that the inner face surface 27 of the base 22 is not spaced-apart from the outer end 72 of the feedthrough aperture 36.

With the electrical connector 20 positioned and orientated according to steps 110, 120, the method 100 includes applying solder 50 into the connector receptacle 14 about the electrical connector at step 130. Or, in those embodiments without a connector receptacle 14, the step 130 includes applying solder 50 onto the housing 12 about the electrical connector 20. The solder 50 applied into the connector receptacle 14 is heated above its melting point, such that the solder is melted, liquefied, or at least malleable when applied into the receptacle. As described above, the connector receptacle 14 may include an outer recess 40 and an inner recess 42. In such implementations, the solder 50 can be applied into both recesses, or just the inner recess 42, as desired. In some embodiments, the connector receptacle 14 may include only a single recess configured similarly to the inner recess 42 such that the step 130 includes applying solder 50 into the single recess of the connector receptacle. The applied solder 50 effectively pools into the connector receptacle 14 and against the entire periphery of the skirt 24 of the electrical connector 20 as shown in FIG. 4 before the solder cools and solidifies to retain the connector in place within the receptacle. Because the inner face surface 27 of the base 22 is flush with the outer end 72 of the feedthrough aperture 36, seepage of the solder 50 between the skirt 24 and receptacle 14 is reduced. Further, because the inner face surface 27 of the base 22 is flush with the outer end 72 of the feedthrough aperture 36, any seepage of solder 50 between the skirt 24 and receptacle 14 is less likely to have voids in the solder, which tend to break and cause splashing of solder onto the inner face surface 27 of the base.

The method 100 includes preventing solder from contacting the base 22 of the electrical connector 20 using the skirt 24 of the connector at step 140. With the electrical connector 20 positioned and orientated according to steps 110, 120 of the method 100, the upper surface 62 of the skirt 24 is elevated above the outer face surface 29 of the base 22. Additionally, following steps 110, 120 of the method 100, the lower surface 60 of the skirt 24 rests on a support surface of the connector receptacle 14 (e.g., a support surface of the inner recess 42). Therefore, the upper surface 62 of the skirt 24 is elevated above at least the support surface of the inner recess 42 by the height of the skirt. In certain implementations, the height of the skirt 24 is sufficiently high that, for embodiments with a connector receptacle 14 having outer and inner recesses 40, 42, the upper surface 62 of the skirt 24 is elevated above the support surface of the outer recess 40, as well as the inner recess 42. Because the skirt 24 extends above the support surfaces of the outer and inner recesses 40, 42, a larger quantity and thickness of the solder 50 can be applied into the connector receptacle 14 and about the electrical connector 20 without the solder spilling over the skirt and onto the outer face surface 29 of the base 22. In other words, the skirt 24 acts as a barrier to prevent the spill-over of solder 50 onto the base 22.

Further, the skirt 24 allows a thickness of the solder 50 to exceed the thickness of the base 22. Consequently, the added quantity and thickness of the solder 50 tends to improve the seal formed between the solder, electrical connector 20, and connector receptacle 14, and promote a stronger retention of the electrical connector to the housing 12. Although not shown, the method 100 may include allowing the solder 50 to harden after applying it into the connector receptacle 14 about the electrical connector 20 at step 130.

Although the illustrated embodiments have been described in relation to a hard disk drive with an electrical connector, in other embodiments, the principles and features of the present disclosure can be applied equally as well to other electronic devices with an electrical connector (e.g., solid state memory devices, semiconductor devices, general computing devices, and the like). Further, the above-described method can be applied to the manufacture of electronic devices with an electrical connector in addition to the manufacture of a hard disk drive.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two."

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

The present subject matter may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus, comprising:
   a housing defining an interior cavity, the housing comprising a feedthrough aperture;
   an electrical connector coupled to the housing over the feedthrough aperture, the electrical connector comprising a base, a plurality of pins extending through the base, and a skirt positioned about a periphery of the base, wherein the pins extend from a location external to the housing to a location within the interior cavity of the housing, and wherein an inner surface of the base is co-planar with an outer end of the feedthrough aperture; and
   solder positioned on the housing and against an entire periphery of the skirt to seal the electrical connector to the housing, wherein at least a portion of the solder is located further away from the interior cavity of the housing than an entirety of the base;
   wherein the skirt comprises a sidewall extending from an inner end to an outer end, and wherein the inner end contacts an exterior surface of the housing about the feedthrough aperture, the outer end being positioned away from the exterior surface of the housing, and wherein the inner surface of the base is flush with the inner end of the skirt.

2. The apparatus of claim 1, wherein the base has a racetrack, elliptical, or ovular shape.

3. The apparatus of claim 1, wherein a portion of the base adjacent the pins is made from an electrically non-conductive material.

4. The apparatus of claim 3, wherein the electrically non-conductive material comprises glass.

5. The apparatus of claim 3, wherein the base is made at least partially from an electrically conductive material, and wherein the base comprises a plurality of pin retainers each made from an electrically non-conductive material, the plurality of pins each extending through a respective one of the plurality of pin retainers.

6. The apparatus of claim 1, wherein the skirt has a height greater than a thickness of the base such that an upper surface of the skirt is elevated above an outer surface of the base.

7. The apparatus of claim 1, wherein the housing comprises a connector receptacle, the feedthrough aperture being formed in the connector receptacle, and wherein the electrical connector and solder are positioned within the connector receptacle.

8. The apparatus of claim 1, wherein the solder has a thickness greater than a thickness of the base.

9. The apparatus of claim 1, wherein the solder has a thickness greater than a thickness of the base.

10. A hard disk drive, comprising:
a hermetically sealed housing defining an interior cavity, the housing comprising a feedthrough aperture;
an electrical connector coupled to the housing over the feedthrough aperture, the electrical connector comprising a base, a plurality of pins extending through the base, and a skirt coupled to the base about a periphery of the base, the skirt having a height larger than a thickness of the base, wherein the pins extend from a location external to the housing to a location within the interior cavity of the housing, and wherein an inner surface of the base is directly adjacent an outer end of the feedthrough aperture, the base having a generally racetrack, elliptical, or ovular shape; and
solder positioned on the housing and against an entire periphery of the skirt to seal the electrical connector to the housing;
wherein the skirt extends away from the interior cavity of the hermetically sealed housing a greater distance than the base; and
wherein the skirt comprises a sidewall extending from an inner end to an outer end, and wherein the inner end contacts an exterior surface of the housing about the feedthrough aperture, the outer end being positioned away from the exterior surface of the housing, and wherein the inner surface of the base is flush with the inner end of the skirt.

11. The hard disk drive of claim 10, wherein the solder has a thickness greater than a thickness of the base.

12. The hard disk drive of claim 10, wherein an upper surface of the skirt is elevated above an outer surface of the base.

13. The hard disk drive of claim 10, wherein the housing comprises a connector receptacle having an outer recess and an inner recess, the electrical connector being positioned within the inner recess and the solder being positioned within the outer and inner recess.

14. The hard disk drive of claim 10, wherein the base is made from glass, and the skirt is made from metal.

15. The hard disk drive of claim 14, wherein a first portion of the base is made from metal, and a second portion comprising a plurality of spaced-apart pin retainers is made from glass, wherein each of the plurality of pins extends through a respective one of the spaced-apart pin retainers.

16. The hard disk drive of claim 10, wherein the inner surface of the base is co-planar with the outer end of the feedthrough aperture.

17. An apparatus, comprising:
a housing defining an interior cavity, the housing comprising a feedthrough aperture;
an electrical connector coupled to the housing over the feedthrough aperture, the electrical connector comprising a base, a plurality of pins extending through the base, and a skirt positioned about a periphery of the base, wherein the pins extend from a location external to the housing to a location within the interior cavity of the housing, and wherein an inner surface of the base is co-planar with an outer end of the feedthrough aperture; and
solder positioned on the housing and against an entire periphery of the skirt to seal the electrical connector to the housing, wherein at least a portion of the solder is located further away from the interior cavity of the housing than an entirety of the base;
wherein:
a portion of the base adjacent the pins is made from an electrically non-conductive material;
the base is made at least partially from an electrically conductive material; and
the base comprises a plurality of pin retainers each made from an electrically non-conductive material, the plurality of pins each extending through a respective one of the plurality of pin retainers.

18. The apparatus of claim 17, wherein the base has a racetrack, elliptical, or ovular shape.

19. The apparatus of claim 17, wherein the skirt has a height greater than a thickness of the base such that an upper surface of the skirt is elevated above an outer surface of the base.

20. The apparatus of claim 17, wherein the housing comprises a connector receptacle, the feedthrough aperture being formed in the connector receptacle, and wherein the electrical connector and solder are positioned within the connector receptacle.

* * * * *